United States Patent [19]

Nagasawa et al.

[11] 4,284,707

[45] Aug. 18, 1981

[54] PHOTOCURABLE LIGHT-SENSITIVE COMPOSITION

[75] Inventors: Kohtaro Nagasawa, Tokyo; Kunio Morikubo, Soka; Tsutomu Satoh, Higashi Kurume, all of Japan

[73] Assignee: Somar Manufacturing Co., Ltd., Tokyo, Japan

[21] Appl. No.: 974,458

[22] Filed: Dec. 29, 1978

[30] Foreign Application Priority Data

Dec. 30, 1977 [JP] Japan .................. 52-160431
Jan. 22, 1978 [JP] Japan .................. 53-5503
Apr. 15, 1978 [JP] Japan .................. 53-43793

[51] Int. Cl.$^3$ .......................... G03C 1/71; G03C 1/68
[52] U.S. Cl. ................... 430/196; 430/197; 430/281; 430/286; 430/288; 430/907; 430/908; 430/910; 430/913; 430/927; 204/159.16; 204/159.17; 204/159.23
[58] Field of Search ............... 96/115 P, 115 R, 35.1, 96/91 R, 91 N, 91 D, 86 P, 93; 204/159.16, 159.23, 159.17; 430/907, 910, 197, 286, 288

[56] References Cited

U.S. PATENT DOCUMENTS

| | | | |
|---|---|---|---|
| 2,937,085 | 5/1960 | Seven et al. ............... | 96/91 R |
| 2,980,534 | 4/1961 | Printy et al. ............... | 96/93 |
| 3,549,367 | 12/1970 | Chang et al. ............... | 204/159.23 |
| 3,601,588 | 5/1972 | Chang ............... | 96/115 P |
| 3,804,631 | 4/1974 | Faust ............... | 430/910 |
| 3,825,430 | 7/1974 | Kurka ............... | 96/115 R |
| 3,856,523 | 12/1974 | Ulrich et al. ............... | 96/115 R |
| 3,930,865 | 1/1976 | Faust et al. ............... | 430/910 |
| 3,953,309 | 4/1976 | Gilano et al. ............... | 96/115 P |
| 4,023,973 | 5/1977 | Imaizumi et al. ............... | 96/115 R |
| 4,092,172 | 5/1978 | Higuchi ............... | 96/115 P |
| 4,123,272 | 10/1978 | Quinn ............... | 96/115 P |
| 4,123,276 | 10/1978 | Kita et al. ............... | 96/115 P |
| 4,139,391 | 2/1979 | Ikeda et al. ............... | 430/910 |
| 4,163,809 | 8/1979 | McGinniss ............... | 204/159.16 |

OTHER PUBLICATIONS

Corcoron; C. et al., "Research Disclosure", #16767, 3/1978.

Primary Examiner—Charles L. Bowers, Jr.
Attorney, Agent, or Firm—Sughrue, Mion, Zinn, Macpeak and Seas

[57] ABSTRACT

A photocurable composition comprising a first copolymer having a recurring unit of general formula (I):

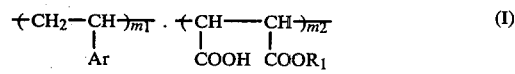

wherein Ar represents a substituted or unsubstituted phenyl group, $R_1$ represents a lower alkyl group, and $m_1$ and $m_2$ are positive numbers with $m_1$ being greater than or equal to $m_2$;

and a second copolymer having a recurring unit of general formula (II):

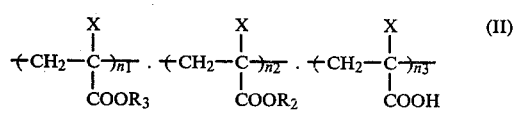

wherein $R_2$ represents a lower alkyl group, X represents a hydrogen atom or a methyl group, and $R_3$ represents an isobutyl group, a t-butyl group or a —$CH_2Ar$ group where Ar represents a substituted or unsubstituted phenyl group and when $R_3$ is —$CH_2Ar$, $R_2$ can also be t-butyl and isobutyl, and $n_1$, $n_2$ and $n_3$ are positive numbers but $n_1$ can be zero and $(n_1+n_2)/n_3$ equals to about 0.5 to 20; and containing suitable amounts of a crosslinking agent and a photoactivator.

18 Claims, No Drawings

PHOTOCURABLE LIGHT-SENSITIVE COMPOSITION

BACKGROUND OF THE INVENTION

1. Field of the Invention

This invention relates to an alkaline developable photocurable material which is useful for the preparation of printing materials, the formation of images, the preparation of printed circuit boards, and the like and, more particularly, to a PS (lithographic printing) plate comprising a light-sensitive layer formed on a sheet or film-like support containing a hydrophilic surface.

2. Discussion of the Prior Art

Various negative light-sensitive materials have been known heretofore. They are generally classified into three types: a first type in which the polymeric compound itself contains a functional group such as an unsaturated bond or an azide group and photocuring is induced directly within the functional polymeric compound or in the optional presence of a photoactivator; and a second type in which the light-sensitive material comprises a mixture of a polymeric compound having no functional group, a normally low molecular weight cross-linking agent having at least two functional groups such as unsaturated groups or azide groups, and a photoactivator, and the non-functional polymeric compound is photocured by the cross-linking agent; and a third type which is combination of the first and second types in which a functional polymeric compound and a cross-linking agent are used together.

When using the first and third types, special consideration must be given to the reproducibility of the quality and properties of the light-sensitive material during manufacture. There are basically two synthetic approaches to a polymer containing a functional group. One approach is to bond a compound containing a functional group (such as an unsaturated bond or an azide moiety) to the reactive cites of a polymer backbone by an addition or condensation reaction or the like. The other is to copolymerize with other monomers, a monomer containing two functional groups of different reactivity, one of which enters into the polymerization reaction to form the polymer chain and the other of which does not react but remains available for photoaction. In both cases, the number of functional groups in the polymer can vary greatly from one batch to the next even if great care is excercised. In the extreme cases, the polymer may gel during reaction or during storage by cross-linking upon itself. Furthermore, a development residue in the form of scum or whisker tends to form during use and the sharpness of the image becomes unsatisfactory. With the second type of material, however, since the polymeric compound is non-functional, there is no restriction on handling such as in purification, and the polymeric compound can be selected from a wide range of materials. Selection of the cross-linking agent can also be performed independently if consideration is given only to its compatibility with the polymeric compound. Thus, it has the general characteristic that a composition excellent in the sharpness of the image and storability is easy to obtain.

Typical examples of the second type composition include a copolymer of methacrylic acid and methyl methacrylate (mole ratio 1:9), a cross-linking agent having ethylenically unsaturated groups and a sensitizer such as an anthraquinone or a combination of a bisimidazole derivative and a diaminobenzoyl derivative (U.S. Pat. Nos. 3,458,311 and 3,549,367). Systems comprising cellulose acetate butyrate, cellulose acetate and a cross-linking agent containing ethylenically unsaturated groups, and a photoactivator, etc., are also known and disclosed in U.S. Pat. No. 3,661,588.

When using the second type composition mentioned above, however, it is necessary to provide a protective layer or film, which is non-sensitive and transparent to actinic light and has low oxygen permeability, on the coated layer. Tracing experiments show that without this type of protective layer, adequate sensitivity and resolution cannot be obtained. In the above-mentioned example, photocuring by the formation of free radicals of ethylenically unsaturated groups is markedly interfered by oxygen. In this regard, with the first type of material, the functional group is introduced directly into the polymer and the affect of oxygen in the air is negligible in practical application.

According to known methods, oxygen-protecting layers are prepared by casting a solution of a water-soluble polymeric compound such as polyvinyl alcohol or polyvinyl pyrrolidone on a light-sensitive layer. Alternatively, the light-sensitive layer is covered with a thin film of polyethylene terephthalate or polypropylene having a thickness of about $25\mu$. The water-soluble polymeric protective layer is removed simultaneously at the time of development with weak alkali. The insoluble thermoplastic protective film is peeled off before development.

Normally, the compound used as the cross-linking agent is a viscous liquid at room temperature. To obtain desirable sensitivities, it is necessary to add the cross-linking agent to such an extent that the light-sensitive layer becomes considerably tacky. Thus, when an original pattern is to be contacted intimately with the light-sensitive layer for exposure, the tackiness of the light-sensitive layer becomes an obstacle without a protective layer, resulting in damaging the original. For this reason, the presence of a protective layer is essential in the known methods.

Usually, a solution of the light-sensitive material in a low boiling organic solvent is cast on the surface of a substrate, and dried under heat to form a light-sensitive layer. It is very complicated from the viewpoint of process steps to cast a solution of a water-soluble polymeric compound on the light-sensitive layer, and dry it under heat to remove water and form a protective layer. The use of a protective film requires a step of laminating the film to the light-sensitive layer. Moreover, in a system having a protective film, it is difficult in practice to resolve a pattern having a smaller line width than the thickness of the film. Scattering of actinic light at the boundary surface between the light-sensitive layer and the protective layer also leads to a deterioration in the sharpness of the image.

Thus, using the second type composition, conventional methods suffers from disadvantages and restrictions because it essentially requires the presence of a protective layer.

SUMMARY OF THE INVENTION

The present invention has for its object the elimination of the defects of the conventional methods, and the provision of a novel light-sensitive material of the second type described above and composed of two kinds of nonfunctional polymeric compounds, a cross-linking agent and a photoactivator, and a method for using the same. One of its characteristics is that the light-sensitive material can be used without providing a non-sensitive protective layer or protective film.

DETAILED DESCRIPTION OF THE INVENTION

The photocurable material is characterized by containing simultaneously two kinds of copolymers the first of which is a binary copolymer having a recurring unit of general formula (I):

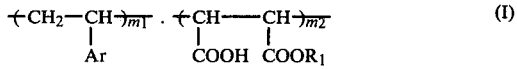

wherein Ar represents a phenyl group which may be substituted, $R_1$ represents a lower alkyl group, and $m_1$ and $m_2$ are positive numbers with $m_1 \geq m_2$; and a second polymer having a recurring unit of general formula (II):

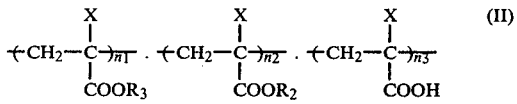

wherein $R_2$ represents a lower alkyl group having 1 to 4 carbon atoms, X represents a hydrogen atom or a methyl group, and $R_3$ represents an isobutyl group, a t-butyl group, or a —$CH_2Ar$ group where Ar represents a phenyl group that may contain a substituent and when $R_3$ is —$CH_2Ar$, $R_2$ can also be t-butyl and isobutyl, and $n_1$, $n_2$ and $n_3$ are positive numbers but $n_1$ can be 0 and $(n_1+n_2)/n_3$ equals to about 0.5 to 20;

and contains suitable amounts of a cross-linking agent and a photoactivator. Depending upon the use, it may also include various secondary ingredients (additives) such as a heat polymerization inhibitor, a coloring agent, a thixotropic agent or a surfactant.

The individual ingredients that make up the photocurable material will now be described. Copolymers I and II are used simultaneously and they function as binders for the cross-linking agent which has the functional groups, the photoactivator and the secondary ingredients and as polymeric compounds which will be cross-linked by the cross-linking agent upon the irradiation of actinic light, and become insoluble in a developer solution. The copolymers I and II contain free carboxyl groups which render them soluble in a weak alkaline developer solution.

Specifically, the copolymer I is a copolymeric compound of styrene or a styrene derivative and a mono lower alkyl maleate, which is derived from styrene or one of its derivatives such as α-methylstyrene, m- or p-vinyltoluene, o- or p-chlorostyrene, or o- or p-methoxystyrene and one of monomethyl maleate, monoethyl maleate, mono-n-propyl maleate, monoisopropyl maleate, mono-n-butyl maleate, monoisobutyl maleate and monotert-butyl maleate. For the purpose of this invention, however, a combination of styrene and monoisopropyl maleate, monoiosbutyl maleate or monotert-butyl maleate is most advantageous. The desirable ratio $m_1/m_2$ of the styrene or its derivative to the monoalkyl maleate in copolymer I is about 5 to 1. The number of styrene or styrene derivative units $(m_1)$ in the polymer may range from about 3 to 750 $(3 \leq m_1 \leq 750)$ and the number of maleate units $(m_2)$ from about 1 to 425 $(1 \leq m_2 \leq 425)$ with $6 \leq m_1 + m_2 \leq 920$. Copolymer I desirably has a molecular weight of about 800 to 100,000, preferably about 1,000 to 50,000.

Copolymer I can be easily synthesized by a method known in the art. For example, when styrene and maleic anhydride are subjected to radical polymerization in a customary manner to form a styrene-maleic anhydride copolymer, and the polymer is reacted under heat with a lower alcohol, a styrene-monoalkyl maleate copolymer is obtained. The alkyl group in the product is the alkyl residue of the lower alcohol used and preferably contains not more than 4 carbon atoms.

REFERENCE EXAMPLE 1

Synthesis of Styrene-monoisopropyl Maleate Copolymer (mole ratio 1:1)

A reactor equipped with a reflux condenser, a nitrogen inlet and a stirrer was charged with 1 liter of benzene, 62.4 g of styrene and 58.8 g of maleic anhydride. In an atmosphere of nitrogen, they were maintained at room temperature to form a uniform solution. Then, 0.6 g of benzoyl peroxide was added to the solution, and the reaction was performed for 1 hour under reflux, whereupon the resulting polymer precipitated. The mixture was allowed to cool at room temperature and filtered. The precipitate was dried to yield 91.5 g of styrene-maleic anhydride copolymer.

30 g of the resulting copolymer was then dispersed in 270 g of isopropyl alcohol, and 0.1 ml of 35% hydrochloric acid was added. The mixture was stirred at 82° C. to 83° C. for 28 hours, and 1 ml of a 4% methanol solution of sodium hydroxide was added. The mixture was filtered. The isopropyl alcohol was distilled off until the volume of the filtrate became about 2/3 to 1/2. The residue was poured with stirring into ISOPAR-E (an alkane-type solvent, a product of Esso Corp., U.S.A.) to yield 38 g (97.5%) of styrene-monoisopropyl maleate copolymer. $[\eta]_{MC}{}^{25°\ C.} = 0.140$ (MC is an abbreviation for methyl cellosolve). Acid value 172. [styrene:monoisopropyl maleate=ca. 1:1 (mole ratio)].

Specifically, copolymer II is obtained by copolymerizing (A) one of benzyl methacrylate (or acrylate) or derivatives thereof (examples of the benzylmethacrylate (or acrylate) derivative include o-, m- or p-chloro-, bromo-, or iodobenzylmethacrylate (or acrylate), o-, m-, or p-nitrobenzylmethacrylate (or acrylate), o-aminobenzylmethacrylate (or acrylate), o-, or p-methoxybenzylmethacrylate (or acrylate), o-methylbenzylmethacrylate (or acrylate), or 2,3-dimethylbenzylmethacrylate (or acrylate)), isobutyl methacrylate (or acrylate) or t-butyl methacrylate (or acrylate), (B) one of methyl methacrylate (or acrylate), ethyl methacrylate (or acrylate), n-propyl methacrylate (or acrylate), isopropyl methacrylate (or acrylate), n-butyl methacrylate (or acrylate), isobutyl methacrylate (or acrylate), and tert-butyl methacrylate (or acrylate), and (C) methacrylic acid (or acrylic acid). The desirable ratio of $(n_1+n_2)/n_3$ of the monomers in the copolymer II is 0.5 to 20 but $n_1$ can be zero in which case a copolymer results in which monomer A is not present. Polymer II desirably consists of about 6 to about 10,000 units of two or three different monomer units and its molecular weight lies between about 1,000 and 1,000,000, preferably between about 50,000 and 500,000. The number of repeating units of each of monomers $n_1$, $n_2$ and $n_3$ polymer II is: 0 to about 7,300 for $n_1$, 1 to about 11,200 for $n_2$ and 1 to about 8,700 for $n_3$ with $6 \leq n_1+n_2+n_3 \, 13,000$. The ratio of $n_1/n_2$ is generally about 0 to 20, the ratio of $n_2/n_3$ about 0 to 20 and the ratio of $n_2/n_3$ about 0.5 to 20.

As stated hereinabove, copolymer II possesses free carboxyl groups by copolymerization of methacrylic or acrylic acid in order to render it developable with weak alkali. When the amount of the free carboxyl groups, i.e., $n_3$, exceeds 60 to 65 mol %, the photocured portion tends to be swollen with the alkaline developer. Hence, a proper range of $n_3$ is about 5 to 60 mol %.

The copolymer II can also be synthesized by a customary method. Some examples are given below.

REFERENCE EXAMPLE 2

Synthesis of Benzyl Methacrylate-Methyl Methacrylate-Methacrylic Acid Copolymer (7.3:1.6:1.1)

A reactor equipped with a nitrogen inlet and a stirrer was charged under a nitrogen atmosphere with 535 g of water, 9.2 g of benzyl methacrylate, 15 g of methyl methacrylate, 12.9 g of methacrylic acid (the mole ratio of the three monomers charged being 6:2:2), 1 g of benzoyl peroxide, 0.3 ml of n-dodecyl mercaptan, and 2.4 g of polyethylene oxide (Polyox-WSR-N-80, molecular weight $2 \times 10^5$, a product of Union Carbide Corporation, U.S.A.), and the monomers were polymerized for 5.5 hours at a stirring speed of 700 to 800 rpm. The resulting product was separated by filtration, washed with water and dried to yield 94 g (88% yield) of benzyl methacrylate-methyl methacrylate-methacrylic acid copolymer as white beads. $[\eta]_{MC}^{25°\,C.}=0.231$. Acid value 40.8. Content of methoxy=3.23%. From the acid value and the methoxy content, the ratio of the constituent monomers in the copolymer II was determined to be: benzyl methacrylate: methyl methacrylate: methacrylic acid of 7.3: 1.6: 1.1.

| IR Characteristic Absorptions (KBr tablet method) | | |
|---|---|---|
| cm$^{-1}$ | Assignment | Intensity |
| 3400 | $\nu$ OH | w |
| 3100–2800 (6) | $\nu$ CH | m |
| 1730 | $\nu$ C=O | s |
| 1460 | $\delta$ as . CH$_3$ | m |
| 1390 | $\delta$ s . CH$_3$ | m |
| 1370 | $\delta$ s . CH$_3$ | m |
| 1150 | $\nu$ CO | s |
| 1080 | $\nu$ CO | m |
| 750 | $\delta$ CH | s |
| 700 | $\delta$ CH | s |

The abbreviations s, m and w respectively show the strong, medium and weak absorptions.

REFERENCE EXAMPLE 3

Synthesis of Benzyl Methacrylate-t-Butyl Methacrylate-Methacrylic Acid Copolymer (5.9:2.3:1.8)

The same apparatus as used in Reference Example 2 was charged under a nitrogen atmosphere with 565 g of water, 97.2 g of benzyl methacrylate, 21.3 g of tert-butyl methacrylate, 12.9 g of methacrylic acid (the mole ratio of the monomers charged being 6:2:2), 1.0 g of benzoyl peroxide, 0.3 ml of n-dodecyl mercaptan, and 2.4 g of polyethylene oxide (described hereinabove), and the monomers were polymerized for 6 hours at 75° to 80° C. at a stirring speed of 700 to 800 rpm. The product was separated by filtration, washed with water and dried to afford 95 g of benzyl methacrylate-tert-butyl methacrylate-methacrylic acid copolymer as white beads. Yield 83.8%. $[\eta]_{MC}^{25°\,C.}=0.293$. Acid value 66.4. tert-Butoxy content=11.0%. From the acid value and the alkoxy content, the ratio of the monomers benzyl methacrylate:tert-butyl methacrylate:methacrylic acid=5.9:2.3:1.8.

| IR Characteristic Absorption | | |
|---|---|---|
| cm$^{-1}$ | Assignment | Intensity |
| 3400 | $\nu$ OH | w |
| 3100–2800 (6) | $\nu$ CH | m |
| 1730 | $\nu$ C=O | s |
| 1460 | $\delta$ as . CH$_3$ | m |
| 1390 | $\delta$ s . CH$_3$ | m |
| 1370 | $\delta$ s . CH$_3$ | m |
| 1260 } | tert-butyl skeleton | m |
| 1220 | | |
| 1150 | $\nu$ CO | s |
| 1080 | $\nu$ CO | w |
| 750 | $\delta$ CH | m |
| 700 | $\delta$ CH | m |

REFERENCE EXAMPLE 4 tert-Butyl Methacrylate-Methyl Methacrylate-Methacrylic Acid Copolymer (mole ratio 5.7:2.2:2.1)

1 liter of commercially available kerosene treated with drying calcium chloride was charged into a reactor equipped with a nitrogen inlet and a stirrer. The inside of the reactor was purged with nitrogen at 70° C., and under a nitrogen atmosphere, one third of a mixture consisting of 255.6 g of tert-butyl methacrylate, 60 g of methyl methacrylate, 51.6 g of methacrylic acid (the mole ratio of the foregoing three being 6:2:2), 3 g of benzoyl peroxide and 1.5 ml of n-dodecyl mercaptan was added dropwise over the course of 15 minutes. After the addition, the mixture was maintained at 80° C. The remaining two thirds portion was added dropwise over 2 hours, maintained at 80° C., and reacted for 5 hours. Since during the reaction the resulting polymer began to precipitate, 200 ml of kerosene was added in four portions. After allowing the reaction mixture to cool, it was heated under reduced pressure to dry it and thus to form 344 g of tert-butyl methacrylate-methyl methacrylate-methacrylic acid copolymer (mole ratio 5.7:2.2:2.1) in a yield of 94%. Acid value 95.9. $[\eta]_{MC}^{25°\,C.}=0.208$.

| IR Characteristic Absorptions (KBr tablet method) | | |
|---|---|---|
| cm$^{-1}$ | Assignment | Intensity |
| 3400 | $\nu$ OH | s |
| 2960 | $\nu$ asym, CH | m |
| 1720 | $\nu$ C=O | s |
| 1460 | $\delta$ asym, CH | w–m |
| 1370 1390 doublet | $\delta$ sym, CH | m |
| 1260 | —C(CH$_3$)$_3$ skeleton | m |
| 1140 } 1270 | $\nu$ —C—O— | s, m |

The IR assignments were determined by reference to the IR spectra of separately synthesized tert-butyl methacrylate-methacrylic acid copolymer and methyl methacrylate-methacrylic acid copolymer.

REFERENCE EXAMPLE 5 tert-Butyl Methacrylate-Methyl Methacrylate-Methacrylic Acid Copolymer (mole ratio 7.0:1.9:1.1)

The reaction was performed under the same reaction conditions and by the same method as in Reference Example 4 using a mixture composed of 99.4 g of tert-butyl methacrylate, 20.0 g of methyl methacrylate, 5.6 g of methacrylic acid (the mole ratio of the above three monomers being 7:2:1), 1 g of benzoyl peroxide and 0.4 ml of n-dodecyl mercaptan. Thus, 102 g of tert-butyl methacrylate-methyl methacrylate-methacrylic acid copolymer (mole ratio 7.0:1.9:1.1) was obtained. Yield 80%. Acid value 46.9. $[\eta]_{MC}^{25°\,C.} = 0.358$. The IR characteristic absorptions were the same as those of Reference Example 4.

REFERENCE EXAMPLE 6 iso-Butyl Methacrylate-Methyl Methacrylate-Methacrylic Acid Copolymer

By the same method and under the same reaction conditions as in Reference Example 4, the dispersing medium was changed from kerosene to ISOPAR-E (an alkane-type solvent, made by Esso Corporation, U.S.A.), and 78.5 g of iso-butyl methacrylate, 15 g of methyl methacrylate, 5.6 g of methacrylic acid (the mole ratio of the three monomers being 5.5:1.5:3), 1 g of benzoyl peroxide and 1 ml of n-dodecyl mercaptan were reacted in 350 ml of the dispersing medium to afford 107 g of iso-butyl methacrylate-methyl methacrylate-methacrylic acid copolymer. Yield 90%. Acid value 169.6. $[\eta]_{MC}^{25°\,C.} = 0.232$.

| cm$^{-1}$ | IR Characteristics Assignment | Intensity |
|---|---|---|
| 3400 | $\nu$ OH | m |
| 2950 | $\nu$ asym, CH | m |
| 1730 | $\nu$ C=O | s |
| 1470 ⎫ 1390 ⎭ | asym, CH | m |
| 1370 doublet | $\delta$ sym, CH | m-w |
| 1270 | $\nu$ —C—O— | m |
| 1170 | CH$_3$ \| —CH—CH$_2$CH$_3$ skeleton | s |

REFERENCE EXAMPLE 7 tert-Butyl Methacrylate-Methyl Methacrylate-Methacrylic Acid Copolymer

The same reaction apparatus as in Reference Example 4 was used, and the stirrer was operated at 250 to 300 rpm. Under a nitrogen atmosphere, 21.3 g of tert-butyl methacrylate, 5 g of methyl methacrylate, 4.3 g of methacrylic acid (the mole ratio of the three monomers being 6:2:2), 0.3 g of benzoyl peroxide, 0.2 ml of n-dodecyl mercaptan, and 0.8 g of polyethylene oxide (POLYOX-WSR-N-80, molecular weight $2 \times 10^5$, a product of Union Carbide Corporation, U.S.A.) were added, and subjected to pearl polymerization at 75° to 80° C. for 3 hours, filtered and washed with water to yield 25.3 g of tert-butyl methacrylate-methyl methacrylate-methacrylic acid copolymer as white beads. Yield 83%. Acid value 82.2. $[\eta]_{DMF}^{25°\,C.} = 0.176$ (DMF is an abbreviation for N,N-dimethyl formamide). The IR characteristic absorptions were the same as those in Reference Example 4.

REFERENCE EXAMPLE 8

Synthesis of Methyl Methacrylate-Methacrylic Acid Copolymer (8:2)

A reactor equipped with a nitrogen inlet and a stirrer was charged with 540 g of commercially available kerosene treated with anhydrous calcium chloride, and purged with nitrogen at 70° C. Under a nitrogen atmosphere, a mixture of 72 g of methyl methacrylate, 15.5 g of methacrylic acid, 0.7 g of azobisisobutyronitrile and 1.8 ml of n-dodecyl mercaptan was added dropwise to the kerosene at 75° C. over the period of 1 hour. The mixture was reacted with stirring at 75° C. for 5 hours to precipitate the resulting copolymer. The precipitate was separated by filtration, and dried at 85° C. under reduced pressure to afford 83 g (95%) of a methyl methacrylate-methacrylic acid copolymer. $[\eta]_{MC}^{25°\,C.} = 0.169$. Acid value 115. (mole ratio of methyl methacrylate to methacrylic acid = 8:2).

A light-sensitive layer prepared from a light-sensitive material made by adding a cross-linking agent and a photoactivator to be described to copolymer I alone has a low light sensitivity and the photocured portion tends to fragment and easily come off. Thus, it has little practical application. Similarly, a light-sensitive layer prepared from copolymer II in a like manner shows considerable tackiness depending upon the cross-linking agent added, and due to the tackiness, the image may be damaged upon peeling after exposure. It has been found that by using the copolymers I and II simultaneously, a light-sensitive material free from practical difficulties can be prepared for the first time.

When copolymer II contains a benzyl ester such as benzyl, p-methoxybenzyl or p-methylbenzyl methacrylate, in comparison to light-sensitive material containing a polymer such as tert-butyl methacrylate-methyl methacrylate-methacrylic acid copolymer, the material containing the benzyl ester has a far higher light sensitivity. As a possible basis for this, while not limiting the invention, since, for example, a tert-butyl group and a benzyl group have a delocalization energy corresponding to 12 and 24.5 k cal/mole, it is considered that the benzyl group is more susceptible to attack by a photochemically activated unsaturated group and, thus, gives a higher rate of photocuring. The energies required for dissociation

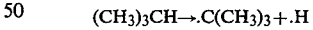

(CH$_3$)$_3$CH→.C(CH$_3$)$_3$ + .H

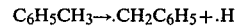

C$_6$H$_5$CH$_3$→.CH$_2$C$_6$H$_5$ + .H (bond dissociation energies) are 90 and 77.5 kcal/mole, respectively, that is, lower in the case of the benzyl group. (C. Walling, *Free Radicals in Solution*, J. Wiley, 1967, p. 50).

When copolymer II contains an isobutyl group or a tert-butyl group, the rate of light sensitization of copolymer II is especially high in comparison with the case of substituting a methyl, ethyl, isopropyl or n-butyl group for the iso- or tert-butyl group. The explanation for this is based on the respective delocalization energies of the ester substituents. For example, a methyl group, an isopropyl group and a tert-butyl group have a delocalization energy corresponding to 0, 4 and 12 kcal/mole, respectively. Susceptibility to attack by a cross-linking agent having photochemically activated unsaturated group increases in this order, and, therefore, it is believed that the rate of photocuring correspondingly increases. The energies required for dissociation

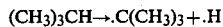

(bond dissociation energies) are 102 and 90 kcal/mole, respectively (see, C. Walling). The foregoing explanation is offered solely for illustration only, and is not intended to restrict this invention.

On the other hand, when a light-sensitive system containing the copolymer I and copolymer II containing isobutyl or t-butyl is compared with a light-sensitive system containing copolymer I and a binary copolymer of methyl methacrylate (or acrylate) or ethyl methacrylate (or acrylate), the former has about 2 to 10 times as high a light sensitivity speed than the latter, and also has the advantage that the strength of the photocured layer is higher. This difference between the two becomes more conspicuous as the thickness of the light-sensitive layer is smaller.

While, copolymer II when $n_1$ equals to zero is advantageously used when the sensitivity is not a critical factor and the thickness of the photosensitive layer is comparatively large, because the synthesis of a binary polymer is, as is generally known, more easily controlled, especially in regard to its reproducibility as compared with that of a ternary polymer. Furthermore, the binary polymer can be obtained by making use of only the cheaper monomers.

The weight ratio of copolymer I to copolymer II (I/II) in the light-sensitive material is set usually within the range of from about 10 to 0.2, preferably about 5 to 0.3. generally, the rate of light sensitization is higher and the cured coating is stronger as the I/II value is lower. On the other hand, the adhesion to the substrate surface tends to be larger as the I/II value is higher. Accordingly, the I/II value should be selected according to the purpose of using the light-sensitive material. The two copolymers are used in the photosensitive composition in a combined amount of from about 40% to 95% by weight based on the solid content of the composition.

The cross-linking agent to be incorporated in the light-sensitive material which is used in this invention is a compound having a boiling point of at least 150° C. and containing at least two ethylenically unsaturated bonds. Compounds containing at least two azide groups can also be utilized. Typical examples of the compound containing at least two ethylenically unsaturated groups include furfuryl acrylate, diethylene glycol diacrylate, triethylene glycol diacrylate, tetraethylene glycol diacrylate, hexamethylene glycol diacrylate, neopentyl glycol diacrylate, trimethylol propane diacrylate, trimethylol propane triacrylate, tetramethylol methane tetraacrylate, resorcinol diacrylate, p,p'-dihydroxydiphenyl diacrylate, and bisphenol A diglycidyl diacrylate; the corresponding methacrylates, i.e., furfuryl methacrylate, diethylene glycol dimethacrylate, triethylene glycol dimethacrylate, tetraethylene glycol dimethacrylate, hexamethylene glycol dimethacrylate, neopentyl glycol dimethacrylate, trimethylol propane dimethacrylate, trimethylol propane trimethacrylate, tetramethylol methane tetramethacrylate, resorcinol dimethacrylate, p,p'-dihydroxydiphenyl dimethacrylate, and bisphenol A diglycidyl dimethacrylate; and diallyl phthalate, diallyl acrylamide, and methylenebis-acrylamide, 5,5-diallylbarbituric acid. Examples of the compounds having at least two azide groups are p,p'-diphenyl bis(azide)methane, p,p'-bis(azide)benzophenone, p,p'-bis(azide)azobenzene, and a compound resulting from the conversion of the diazo groups of a condensate of p-diazodiphenylamine and formaldehyde into azide groups.

The cross-linking agent to be added to the light-sensitive material is selected from the above-exemplified compounds and analogous compounds thereof in consideration of the rate of light sensitization, and its compatibility with copolymers I and II, its corrosive action on the photocured portion, etc. Two or more cross-linking agents may be added at the same time. The amount of the cross-linking agent in the light-sensitive material is within the range of about 5 to 150% by weight based on the total weight of the copolymers I and II. When the amount of the cross-linking agent is less than 5%, feasible speeds of light sensitization cannot be obtained. If it exceeds 150%, the light-sensitive material becomes tacky, and can be used only in special applications.

As the photoactivator, there can be used ketones and derivatives thereof such as benzophenone, benzil, p,p'-bis(dimethylamino)benzophenone, p,p'-bis(diethylamino)benzophenone, benzoin methyl ether, benzoin ethyl ether, benzoin isopropyl ether and benzoin butyl ether; quinoid compounds such as anthraquinone, acenaphthenequinone, β-tert-butylanthraquinone, and phenanthrenequinone, some heterocyclic compounds such as primulin, carbazole, xanthone and thioxanthone; polyhaloalkanes such as carbon tetrabromide, ω,ω,ω-tribromomethylphenylsulfone; and other various known photoactivators. The amount of the photoactivator added is 0.01 to 20% by weight, preferably 0.1 to 10% by weight, based on the total weight of the copolymers I and II and the cross-linking agent.

As another ingredient contained in the lightsensitive material, it is desirable to use an ordinary heat polymerization inhibitor for inhibiting a dark reaction during storage. For this purpose, hydroquinone, p-methoxyphenol, pyrogallol, 2,6-di-tert-butyl-p-cresol, cupferron, etc., can be utilized. The amount of the heat polymerization inhibitor is determined within the range of 0.001 to 1% by weight based on the total weight of the copolymers I and II and the cross-linking agent.

The light-sensitive material may be colored by adding known dyes or finely divided pigment particles as a colorant so that the light-sensitive layer and the photocured image can be easily discerned when the light-sensitive material is used for printing plate preparation, the preparation of printed circuit base boards, chemical milling, and for microprocessing of other planar substrates. A surface active agent may also be added to improve levelling property and wettability of the substrate surface at the time of coating the light-sensitive material on the surface. Specific examples of the colorant and surfaceactive agent are described in Examples.

When the light-sensitive material is to be used to prepare high contrast images or design patterns for decorative and marking purposes, it is necessary to add a dye, especially preferably a pigment, in a high concentration apart from the purpose of discerning the light-sensitive layer and the photocured image. For the preparation of high contrast images, the use of black pigments such as carbon black or iron black is desirable. The amount of the pigment added is in the range of 10 to 300% based on the total amount of the copolymers I and II, and the cross-linking agent. In the preparation of design patterns, too, dyes preferably pigments, which are toned to various colors of yellow, orange, red, blue, green, black, or white as a main note are used in similar amounts. Needless to say, the colorant is one essential ingredient when the light-sensitive material is used for image formation of this kind. It is selected from various commercially available dyes and pigments conventionally used for such purpose.

The method of using the light-sensitive material of this invention and the characteristics of the light-sensitive material incident to it are described below.

The light-sensitive material can be formed into a sheet or film by heat-fusion and injection, and this can be especially useful when a thickness of 100μ or more is desired. Usually, the light-sensitive material is dissolved in an organic solvent, and the solution is cast on the surface of a substrate, followed by evaporation of the solvent to form a light-sensitive layer. As the organic solvent used for this purpose, ketones such as acetone, methyl ethyl ketone or cyclohexanone, cellosolves (ethylene glycol monoalkyl ethers) such as methyl cellosolve, ethyl cellosolve or butyl cellosolve, lower fatty acid esters of cellosolves such as methyl cellosolve acetate or ethyl cellosolve acetate, alcohols such as methyl alcohol, cyclic ethers such as tetrahydrofuran or dioxane, polar solvents such as N-methyl pyrrolidone or DMF, are used alone. Also, an alcohol, a benzenoid solvent, an ester, or haloalkane (for example, ethyl alcohol, isopropyl alcohol, benzene, xylene, monochlorobenzene, ethyl acetate, butyl acetate, isoamyl acetate or dichloromethane) may be mixed with the aforesaid solvents and used as a solvent for the light-sensitive material.

The viscosity of the solvent solution of the light-sensitive material, i.e., the light-sensitive solution, varies depending upon the purpose of use and the coating method used to form the light-sensitive layer, but is usually adjusted to about 10 cps to 500 cps.

The light-sensitive solution can be coated by any of various methods known in the art, such as by a roll coater or a rotary coating machine, such as a spinner or whirler, spray coating, dip coating, wire bar coating, gravure coating, or kiss coating, and the solvent is removed by heating to form a light-sensitive layer on the surface of the substrate.

It is not necessary in practice to provide a protective layer or a protective film on the light-sensitive layer for the purpose of preventing the hampering of photocuring by the influence of oxygen. It is one of the characteristics of the invention that the light-sensitive layer can be directly exposed through an original transparancy contacted intimately therewith, or in proximity thereto.

Light sources for photocuring the light-sensitive layer which can be advantageously used are low pressure, medium pressure, high pressure, or superhigh pressure mercury vapor lamps, metal halide-containing mercury vapor lamps, carbon arc lamps, and xenon lamps which emit an abundance of actinic light in the ultraviolet and near ultraviolet regions.

When after the exposure, the light-sensitive layer on the substrate is dipped in a several percent aqueous solution of a weak inorganic base such as sodium carbonate or sodium silicate or ammonia or an organic base such as ethanolamine, the non-exposed portion is easily removed, and a negative image of the original is formed on the substrate surface.

Depending upon the purpose of use, the photocured portion needs to be removed after subjecting to the etching or plating step, for example. The removal can be easily effected by dipping in an about 5% aqueous solution of an alkali metal hydroxide.

The following Examples illustrate the light-sensitive material more specifically.

In the Examples, all parts are by weight. The mole ratios of the constituent monomers in the copolymers I and II show the ratios of the monomers present in the copolymers.

EXAMPLE 1

The following ingredients were dissolved in 500 parts of ethyl cellosolve to prepare a light-sensitive solution having a viscosity of 48 cps (25° C.).

|  | parts by weight |
|---|---|
| Copolymer I: |  |
| Styrene-monoisopropyl maleate copolymer (mole ratio 1:1) | 50 |
| Copolymer II: |  |
| Benzyl methacrylate-methyl methacrylate-methacrylic acid copolymer (mole ratio 73:16:11) synthesized in Reference Example 2 | 50 |
| Cross-Linking Agent: |  |
| Triethylene glycol diacrylate | 40 |
| Ethylene glycol diacrylate | 30 |
| Photoactivator: |  |
| Benzoin ethyl ether | 8 |
| p,p'-bis(dimethylamino)benzophenone | 2 |
| Heat Polymerization Inhibitor: |  |
| p-Methoxyphenol | 0.01 |
| Colorant: |  |
| C.I. Solvent Blue 73 | 1 |
| Surfactant: |  |
| Polyoxyethylene sorbitan monolaurate | 0.5 |

The light-sensitive solution was coated by a roll coater on an aluminum plate which had been ball-grained and surface-roughened by anodic oxidation to form a light-sensitive layer having a dry thickness of 3μ and thus to prepare a lithographic printing plate.

A negative printed original and a step tablet (Kodak Photographic Step Tablet No. 2) were contacted intimately in vacuo with the light-sensitive layer of the printing plate, and the light-sensitive layer was irradiated for 30 seconds with light from a superhigh pressure mercury vapor lamp (3 kw) placed at a distance of 1 m (intensity 4.7 mW/cm$^2$).

The exposed printing plate was dipped for 1 minute in a 3% aqueous solution of sodium silicate at 20° C., washed with water, rinsed with a 3% aqueous solution of phosphoric acid, and again washed with water. A solution of gum arabic was coated on the plate and dried to obtain a positive master plate.

The first to sixth steps of the step tablet were cured in the master plate. It was mounted on an offset printing press and printing was performed. More than 200,000 printed copies of good quality were obtained.

For comparison, 50 parts of tert-butyl methacrylate-methyl methacrylate-methacrylic acid copolymer (mole ratio 5.8:2.0:2.2) was used while maintaining the other ingredients unchanged. The light-sensitive solution was coated on the same substrate as above to prepare a lithographic printing plate having a light-sensitive layer with a dry thickness of 3μ. Exposing and development in the same way resulted in the curing of the 1st to 5th steps of the step tablet, and the exposure time required for the curing of the 1st to 6th steps was 40 seconds.

EXAMPLE 2

The following ingredients were dissolved in 700 parts of ethyl cellosolve to form a light-sensitive solution having a viscosity of 26 cps (25° C.).

|  | parts by weight |
|---|---|
| Copolymer I: |  |
| Styrene-monoisopropyl maleate copolymer (mole ratio 1:1) | 60 |
| Copolymer II: |  |
| Benzyl methacrylate-t-butyl-methacrylate-methacrylic acid copolymer (mole ratio 59:23:18) | 40 |
| Cross-Linking Agent: |  |
| Trimethylol propane triacrylate | 50 |
| Ethylene glycol diacrylate | 10 |
| Photoactivator: |  |
| Benzoin isobutyl ether | 8 |
| p,p'-bis(diethylamino)benzophenone | 1 |
| Heat Polymerization Inhibitor: |  |
| p-Methoxyphenol | 0.01 |
| Colorant: |  |
| C.I. Solvent Blue 73 | 1 |
| Surfactant: |  |
| Polyoxyethylene sorbitan monolaurate | 0.5 |

The light-sensitive solution was coated by a spinner (rotary coating machine) at 900 rpm on a flexible board having a base of a polyimide film and clad with a 35μ copper foil, and dried at 70° C. to form a light-sensitive layer having a thickness of 5μ. The surface of the copper foil had been degreased with 1,1,1-trichloroethylene, treated with 3% hydrochloric acid, and washed with water in a customary manner.

The light-sensitive layer was brought into intimate contact with a test pattern (TOPPAN RESOLUTION TEST TARGET, a product of Toppan Printing Company), and exposed for 2 seconds using a mask alignment device (a product of Kyowa Riken, light source, a superpressure mercury vapor lamp, 100 v, 250 w, the exposure area 60 mm in diameter). The exposed flexible board was dipped in a 0.5% aqueous solution of sodium carbonate and treated for 2 minutes at 20° C., washed with water, rinsed with 3% phosphoric acid, and again washed with water to form a negative image of the test pattern on the copper foil. The copper foil was etched with a 40° Bé aqueous solution of ferric chloride, and the board was dipped in a 5% aqueous solution of sodium hydroxide at 25° C. for 5 minutes to remove the photocured portion, followed by washing with water.

The copper pattern fully resolved a line width of 7μ, and the edge had a good sharpness.

When there was used a light-sensitive solution having the same composition as above except that the same amount of a tert-butyl methacrylate-methyl methacrylate-methacrylic acid copolymer (mole ratio 6.0:2.3:1.7) was used instead of copolymer II, the exposure time had to be increased to 4 seconds in order to prepare a similar copper pattern.

EXAMPLE 3

|  | parts by weight |
|---|---|
| Copolymer I: |  |
| Styrene-mono-t-butyl maleate copolymer (mole ratio 2:1) | 70 |
| Copolymer II: |  |
| Benzyl methacrylate-methyl methacrylate-methacrylic acid copolymer (mole ratio 6.9:2.0:1.1) | 30 |

The copolymers I and II were dissolved in 350 parts of butyl acetate, and kneaded with a 3-roll mill together with 250 parts of carbon black to form a pigment dispersion.

A mixture of the following ingredients was added to a mixture consisting of 35 parts of methyl cellosolve and 5 parts of methyl cellosolve acetate to form a uniform pigment dispersion having a viscosity of 200 cps (25° C.).

|  | parts by weight |
|---|---|
| Pigment dispersion obtained | 70 |
| Cross-Linking Agent: |  |
| Trimethylol propane triacrylate | 6 |
| Tetraethylene glycol diacrylate | 4 |
| Photoactivator: |  |
| Benzophenone | 4 |
| p,p'-bis(diethylamino)benzophenone | 0.5 |
| Heat Polymerization Inhibitor: |  |
| p-Methoxyphenol | 0.01 |
| Surfactant: |  |
| Polyoxyethylene sorbitan monolaurate | 0.6 |

The pigment dispersion was coated on a biaxially oriented polyethylene terephthalate film (75μ thick) having a roughened surface using a wire bar coater (0.4 mm in diameter), and dried at 70° C. to form a black light-sensitive film with a dry coating thickness of 5μ.

A test pattern was brought into intimate contact with the black-light-sensitive film, and it was irradiated for 40 seconds with light from a superhigh pressure mercury vapor lamp (3 kw) disposed at a distance of 80 cm (intensity 6.5 mw/cm²).

The exposed light-sensitive film was dipped for 30 seconds in a 0.5% aqueous solution of monoethanolamine at 20° C. to develop it, and spray-washed with water at 1.5 kg/cm² to remove the residue, and dried to form a black negative image. The image can be used as a master plate for a map, an original for screen printing, etc. The non-imaged area was the mat surface of the base film, and had surface graphic properties.

The image resolved a circle with a diameter of 50μ, and a line drawing with a line width of 50μ. The product had the following optical densities, and could be fully used as an original.

|  | Optical Density* | |
|---|---|---|
|  | Imaged Area | Non-Imaged Area |
| Green filter density (Kodak Wratten #93) | 4.5 | 0.10 |
| Blue filter density (Kodak Wratten #18A) | 5.2 | 0.15 |

*densitometer made by the MacBeth Division, Kalmargen Co., Newburgh, N.Y.

EXAMPLE 4

The following ingredients were dissolved in 900 parts of ethyl cellosolve to form a light-sensitive solution having a density of 45 cps (25° C.).

|  | parts by weight |
|---|---|
| Copolymer I: | |
| Styrene-monoisopropyl maleate copolymer (mole ratio 1:1) | 50 |
| Copolymer II: | |
| tert-Butyl methacrylate-methyl methacrylate-methacrylic acid copolymer (mole ratio 5.7:2.2:2.1) of Reference Example 4 | 50 |
| Cross-Linking Agent: | |
| Triethylene glycol diacrylate | 40 |
| Ethylene glycol diacrylate | 30 |
| Photoactivator: | |
| Benzoin ethyl ether | 8 |
| p,p'-bis(dimethylamino)benzophenone | 2 |
| Heat Polymerization Inhibitor: | |
| p-Methoxyphenol | 0.01 |
| Colorant: | |
| C.I. Solvent Blue 73 | 1 |
| Surfactant: | |
| Polyoxyethylene sorbitan monolaurate | 0.5 |

The light-sensitive solution was coated by a roll coater on an aluminum plate ball-grained and then surface-treated by anodic oxidation, and dried to form a light-sensitive layer having a thickness of 3μ to form a lithographic printing plate.

A negative printed original was closely adhered in vacuo to the light-sensitive layer of the resultant printing plate, and the light-sensitive layer was irradiated for 40 seconds with light from a superhigh pressure mercury vapor lamp (3 kw) placed at a distance of 1 m (light density 4.7 mW/cm²).

The exposed printing plate was dipped for 1 minute in a 3% aqueous solution of sodium silicate at 20° C., washed with water, rinsed with 3% phosphoric acid, and again washed with water. A solution of gum arabic was coated on the plate and dried to afford a positive master plate.

The master plate was mounted on an offset printing press, and more than 200,000 printed copies of good finish were obtained.

The printing plate was stored for 18 months, and then, extensively examined for sensitivity, developability, resolution, ink receptivity and ink transfer on the printing plate surface, etc. No change was noted.

EXAMPLES 5 TO 10 AND COMPARATIVE EXAMPLES 1 AND 2

All ingredients were maintained at the same proportions as in Example 4, and lithographic printing plates and master plates were produced in the same way as in Example 4, except the total weight of the copolymers I and II was changed to 100 parts, and the copolymers I and II and the ratio between I and II were changed as shown in Table 1. The test results with these plates are shown in Table 2. In the Comparative Examples cited for reference, the total weight of the copolymer I and the binary copolymer was adjusted to 100 parts, and all other ingredients and the methods of preparing printing plates and master plates were kept the same as in Example 4 for comparative purposes.

TABLE 1

Mixing Ratios of Copolymers in the Light-Sensitive Material

|  | Example | | | | | |
|---|---|---|---|---|---|---|
|  | 5 | 6 | 7 | 8 | 9 | 10 |
| Copolymer I | | | | | | |
| Styrene-monoisopropyl maleate Copolymer | 2 | 2 | 1 | 1 | 3 | 1 |
| (mole ratio) | (1:1) | (1:1) | (1:1) | (1:1) | (1:1) | (1:1) |
| Copolymer II | | | | | | |
| tert-Butyl methacrylate-methyl methacrylate-methacrylic acid copolymer | 1 | 1 | 1 | 1 | 1 | 1 |
| (mole ratio) | (7:1.9:1.1) | (6:3:1) | (6:2:2) | (5.5:1.5:3) | (5:5:2) | (2:6:2) |
| Remarks | Synthesized in Reference Example 5 | — | Synthesized in Reference Example 7 | — | — | — |

|  | Comparative Example | |
|---|---|---|
|  | 1 | 2 |
| Copolymer I | | |
| Styrene-monoisopropyl maleate copolymer | 1 | 1 |
| (mole ratio) | (1:1) | (1:1) |
| Binary Copolymer | | |
| tert-Butyl methacrylate-methacrylic acid copolymer | 1 | |
| (mole ratio) | (8:2) | |
| Methyl methacrylate-methacrylic acid copolymer | | 1 |
| (mole ratio) | | (8:2) |

Each composition was tested in the following regards.

Coatability

A roll coater and a rotary coating machine (a vertical whirler) were used, and evaluation was made as to whether a uniform film surface was formed. Evaluation C corresponds to poor.

Sensitivity

Evaluation was based on the time required for printing until the first to sixth steps of a √2 step tablet (Kodak Photographic Step Tablet No. 2) cured solid, and the strength of the cured film. Evaluation was as follows: A—40 seconds (excellent), B—60 seconds (good), C—90 seconds or more, or curing insufficient (fair to poor).

Developability

The materials were dipped in a 3% aqueous solution of sodium silicate (JIS No. 3), and the evaluation was made based on the ease of development and the presence or absence of a development residue.

Ink Receptivity (ink adhesion) and Transferability (transferability to a rubber blanket)

The developed materials were used in two-color printing press made by Heiderberg Company, and their properties were evaluated based on the quality of printed matter and the number of spoilages (spoiled printed copies that are formed at the start of printing). The evaluation was as follows: A—the results of a visual test on the printed matter were excellent, and the number of spoilages was about 20 to 30; B—the results of a visual test on the printed matter were good, and the number of spoilages was about 30 to 50.

IPA Dampening Water Resistance

Commercially available dampening water containing IPA (isopropyl alcohol) was used, and the swellability of the plate surface and the state of the plate surface after continuous printing of 50,000 copies were examined.

U.V. Ink Resistance

A commercially available ultraviolet-curable ink was used, and the state of the plate surface was examined. Evaluation C corresponds to poor.

Durability

Evaluation A—the number of copies that can be printed continuously was more than 200,000, and printing could be further continued; evaluation B—up to about 100,000 to 200,000 copies; evaluation C—less than 100,000 copies.

TABLE 2

| Test Items | Example | | | | | | Comparative Example | |
|---|---|---|---|---|---|---|---|---|
| | 5 | 6 | 7 | 8 | 9 | 10 | 1 | 2 |
| Coatability | | | | | | | | |
| Roll coater | A | A | A | A | A | A | C | A |
| Rotary coater | A | A | A | A | A | A | A | A |
| Sensitivity | A | A | A | A | A | B | A | B |
| Developability | A | A | A | A | A | A | A | A |
| Ink receptivity and transfer on the plate surface | A | A | A | A | A | B | A | B |
| IPA dampening water resistance | A | A | A | B | A | B | A | B |
| UV ink resistance | A | A | A | B | B | B | A | C |
| Durability | A | A | A | B | A | B | A | B |

In Table 2, the evaluations correspond to: A-Excellent; B-Good; C-Fair to Poor.

EXAMPLE 11

The following ingredients were dissolved in 680 parts of methyl cellosolve to form a light-sensitive solution having a viscosity of 28 cps (25° C.).

| | parts by weight |
|---|---|
| Copolymer I: | |
| Styrene-monoisopropyl maleate copolymer (mole ratio 2:1) | 70 |
| Copolymer II: | |
| tert-Butyl methacrylate-methyl methacrylate-methacrylic acid copolymer synthesized in Reference Example 5 (mole ratio 7:1.9:1.1) | 30 |
| Cross-Linking Agent: | |
| Triethylene glycol diacrylate | 10 |
| Trimethylolethane triacrylate | 50 |
| Photoactivator: | |
| p,p'-bis(Dimethylamino)thiobenzophenone | 3 |
| Benzoin isopropyl ether | 6 |
| Heat Polymerization Inhibitor: | |
| p-Methoxyphenol | 0.01 |
| Surface Active Agent: | |
| Polyoxyethylene sorbitan monolaurate | 0.5 |
| Colorant: | |
| C.I. Solvent Blue 73 | 1 |

The light-sensitive solution was coated by a spinner (rotary coating machine) at 1,000 rpm on a flexible board having a base of a polyimide film and clad with a 35μ copper foil, and dried at 70° C. to form a light-sensitive layer having a thickness of 5μ. The surface of the copper foil had been degreased with 1,1,1-trichloroethylene, treated with 3% hydrochloric acid, and washed with water in a customary manner.

The light-sensitive layer was brought into intimate contact with a test pattern (TOPPAN RESOLUTION TEST TARGET, a product of Toppan Printing Company), and exposed for 3 seconds using a mask alignment device (a product of Kyowa Riken; light source; a superpressure mercury vapor lamp, 100 v, 250 w, the exposed area 60 mm in diameter). The exposed flexible board was dipped in a 0.5% aqueous solution of sodium carbonate and treated for 2 minutes at 20° C., washed with water, rinsed with 3% phosphoric acid, and again washed with water to form a negative image of the test pattern on the copper foil. The copper foil was etched with a 40° Bé aqueous solution of ferric chloride, and the board was dipped in a 5% aqueous solution of sodium hydroxide at 25° C. for 5 minutes to remove the photocured portion, followed by washing with water.

The copper pattern fully resolved a line width of 7μ, and the edge had a good sharpness.

EXAMPLE 12

A light-sensitive solution having a viscosity of 28 cps (25° C.) in accordance with the same recipe as in Example 11 except that 30 parts of a methyl methacrylate-methacrylic acid copolymer (mole ratio 8.3:1.7) was used instead of copolymer II in the light-sensitive solution of Example 11.

A light-sensitive layer having a thickness of 5.5μ was formed on a flexible board under the same conditions as in Example 11.

When it was exposed by the same device as used in Example 11, it was found that the exposure should be performed for 15 to 20 seconds in order to induce sufficient photocuring.

EXAMPLE 13

The following ingredients were dissolved in 540 parts of ethyl cellosolve to form a light-sensitive solution having a viscosity of 24 cps (25° C.).

|  | parts by weight |
|---|---|
| Copolymer I: | |
| Styrene-monoethyl maleate copolymer (mole ratio 1.5:1) | 45 |
| Copolymer II: | |
| tert-Butyl methacrylate-methyl methacrylate-methacrylic acid copolymer (mole ratio 7:2:1) | 55 |
| Cross-Linking Agent: | |
| p,p'-bis(azide)benzophenone | 12 |
| Photoactivator: | |
| Thioxanthone | 5 |
| Surfactant: | |
| Fluorard FC 430 (a fluorine-type surfactant made by Sumitomo 3M) | 0.5 |
| Colorant: | |
| C.I. Solvent Blue 3 | 1 |

In the same way as in Example 11, the light-sensitive solution was coated on a polyimide-base flexible board and dried to form a light-sensitive layer having a thickness of 2μ. A test pattern was printed on it for 1 second by using a mask alignment device, and treated in the same way as in Example 11. The copper pattern resolved a line width of 10μ.

EXAMPLE 14

|  | parts by weight |
|---|---|
| Copolymer I: | |
| Styrene-monoisopropyl maleate copolymer (mole ratio 1:1) | 40 |
| Copolymer II: | |
| iso-Butyl methacrylate-methyl methacrylate-methacrylic acid copolymer (mole ratio 6:2:2) | 60 |

The copolymers I and II above were dissolved in 150 parts of butyl acetate, and kneaded on a three-roll mill together with 96 parts of carbon black to form a pigment dispersion.

A mixture of the following ingredients was added to a mixture of 25 parts of methyl cellosolve and 20 parts of methyl cellosolve acetate to form a uniform pigment dispersion having a viscosity of 150 cps (25° C.).

|  | parts by weight |
|---|---|
| Pigment dispersion above described | 50 |
| Cross-Linking Agent: | |
| Trimethylol propane triacrylate | 6 |
| Tetraethylene glycol diacrylate | 6 |
| Photoactivator: | |
| Benzophenone | 4 |
| p,p'-bis(diethylamino)benzophenone | 0.5 |
| Heat Polymerization Inhibitor: | |
| Cupferron | 0.01 |
| Surfactant: | |
| Polyoxyethylene sorbitan monolaurate | 0.6 |

The pigment dispersion was coated on a biaxially oriented polyethylene terephthalate film (75μ thick) whose surface had been roughened by sand matting by using a wire bar coater (0.5 mm in diameter), and dried at 70° C. to form a black light-sensitive film with a dry coating thickness of 5μ.

A test pattern was brought into intimate contact with the light-sensitive film, and it was irradiated for 60 seconds with light from the superhigh pressure mercury vapor lamp (3 kw) disposed at a distance of 80 cm (intensity 6.5 mw/cm$^2$).

The exposed light-sensitive film was dipped for 30 seconds in a 0.5% aqueous solution of ethanolamine at 20° C. to develop it, andd spray-washed with water at 1.5 kg/cm$^2$ to remove the residue, and dried to form a black image. The image can be used as a master plate for a map, an original for screen printing, etc. The mat surface of the base film revealed at the non-exposed area had surface graphic properties.

The densities of the images were measured, and the following results were obtained using a MacBeth densitometer.

|  | Image Portion | Background Portion |
|---|---|---|
| Green filter (Kodak Wratten #93) | 4.2 | 0.10 |
| Blue filter (Kodak Wratten #18A) | 5.0 | 0.15 |

The image resolved a circle having a diameter of 50μ, and a line drawing image with a line width of 50μ.

EXAMPLE 15

The following ingredients were dissolved in 265 parts by weight of ethylene glycol monomethyl ether to form a light-sensitive solution having a viscosity of 30 cps (25° C.).

|  | parts by weight |
|---|---|
| Copolymer (I): | |
| Styrene-monoisopropyl maleate copolymer of Reference Example 1 | 30 |
| Copolymer (II): | |
| Methyl methacrylate-methacrylic acid copolymer of Reference Example 8 | 40 |
| Cross-Linking Agent: | |
| Tetraethylene glycol diacrylate | 41 |
| Photoactivator: | |
| Benzoin ethyl ether | 6 |
| Heat Polymerization Inhibitor: | |
| p-Methoxyphenol | 0.01 |
| Colorant: | |
| C.I. Solvent Red No. 109 | 0.5 |
| Surfactant: | |
| Polyoxyethylene sorbitan monolaurate | 0.5 |

The light-sensitive solution was coated on a phenol resin laminate board one surface of which had been clad with 1 ounce of a copper foil and had been degreased with 1,1,1-trichloroethane, treated with 5% HCl and washed with water. The solution was dried at 80° C. to form a light-sensitive layer having a thickness of 10μ on the copper-clad surface.

A test pattern of a polyethylene terephthalate film base was brought into intimate contact in vacuo with the light-sensitive layer, and the light-sensitive layer was irradiated for 60 seconds with light from a high pressure mercury vapor lamp (3 kw) at a distance of 1 m (intensity 4.7 mw/cm$^2$). The exposed laminate was dipped for 2 minutes in a 0.5% aqueous solution of sodium carbonate, washed with water, rinsed with 3% H₃PO₄, again washed with water, and dried.

The laminate plate was then etched by being dipped for 5 minutes in a 40° Bé aqueous solution of FeCl₃, washed with water, and finally dipped for 2 minutes in a 5% aqueous solution of NaOH at 25° C. to remove the photocured portion.

The copper pattern obtained by the above treatment had a very good delineation. Intrusion of the copper etching solution was not noted, and the copper pattern resolved a line width of 20μ.

EXAMPLE 16

The following ingredients were dissolved in 203 parts by weight of ethylene glycol monomethyl ether to afford a light-sensitive solution having a viscosity of 38 cps (25° C.).

| | parts by weight |
|---|---|
| Copolymer (I): | |
| Styrene-monoethyl maleate copolymer (mole ratio 1.5:1.1) | 35 |
| Copolymer (II): | |
| Methyl methacrylate-methacrylic acid copolymer (mole ratio 8.3:1.7) | 28 |
| Cross-Linking Agent: | |
| Trimethylol propane triacrylate | 18 |
| Diethylene glycol diacrylate | 17 |
| Photoactivator: | |
| p,p'-bis(diethylamino)benzophenone | 0.35 |
| Benzil | 0.24 |
| Heat Polymerization Inhibitor: | |
| Cupferron | 0.01 |
| Colorant: | |
| 1-Methylaminoanthraquinone (red disperse dye) | 0.7 |
| Surfactant: | |
| Polyoxyethylene sorbitan monolaurate | 0.4 |

The light-sensitive solution was coated on the surface of a commercially available trimetal plate material composed of iron-copper-chromium (uppermost layer) having iron as a base plate by rotating a whirler at 60 rpm, and dried at 75° C. to form a light-sensitive layer having a dry thickness of about 15μ. The light-sensitive layer was exposed under the same conditions as in Example 15 using a test pattern for printing, then dipped for 2 minutes in a 1% aqueous solution of ethanolamine at 25° C., washed with water and dried. Thus developed, the plate was dipped in an aqueous chrome etching solution containing 30% by weight of CaCl₂, 25% by weight of ZnCl₂, 2% by weight of NH₄Cl and 3% by weight of conc. nitric acid at 25° C. until the copper surface at the nonexposed area was revealed. The resulting trimetal plate resolved 175 lines/inch, and the reproducibility of dots ranging from 5% to 95% was satisfactory. The removal of the coating in this case was performed under the same conditions as in Example 15.

EXAMPLE 17

The following ingredients were dissolved in a mixture consisting of 200 parts by weight of ethylene glycol monomethyl ether and 100 parts by weight of diethylene glycol diethyl ether to form a light-sensitive solution having a viscosity of 26 cps (25° C.).

| | parts by weight |
|---|---|
| Copolymer (I): | |
| Styrene-monomethyl maleate copolymer (resulting from the monoesterification with methyl alcohol of SMA #2000 which is a trademark for a styrene/maleic anhydride copolymer (mole ratio 2:1) produced by Alco Chemical Co. of U.S.A.) | 35 |
| Copolymer (II): | |
| Methyl methacrylate-methacrylic acid copolymer (mole ratio 7.2:2.8) | 30 |
| Cross-Linking Agent: | |
| Trimethylol propane triacrylate | 22 |
| Trimethylol propane diacrylate | 19 |
| Photoactivator: | |
| p,p'-bis(dimethylamino)benzophenone | 0.4 |
| Acenaphthenequinone | 0.05 |
| Heat Polymerization Inhibitor: | |
| p-Methoxyphenol | 0.02 |
| Colorant: | |
| C.I. Pigment Blue 3 | 5 |

The light-sensitive solution was coated on a flexible print board of a polyimide base clad with 1 ounce of a copper foil using a doctor blade and dried to a thickness of 25μ. The plating and soldering resistances of the light-sensitive layer were tested.

The copper surface was treated with 3% HCl, and tested using a highthrow-tin-lead borofluoride plating bath made by Akebono Sangyo Company at a current density at the cathode of 1.62 A/dm² with the anode/cathode ratio of 2:1 under conditions which would form a plated layer with a thickness of 2.5μ in 3 minutes. As regards the soldering resistance test, the light-sensitive layer was dipped in a solder bath maintained at 260° C. for 10 seconds, and this dipping was repeated three times.

From the results of these tests, it was judged that the above light-sensitive material had sufficient resistance to plating and soldering.

When this light-sensitive solution was stored in a cold dark place in a laboratory for 18 months, no change was noted in the rate of light sensitization and resolution, and there was no sign of gellation.

COMPARATIVE EXAMPLES 3 TO 5

In Comparative Examples 3 to 5, the copolymers and the common ingredients indicated below were dissolved in a mixture consisting of 250 parts by weight of ethylene glycol monoethyl ether and 80 parts by weight of ethylene glycol monoethyl ether acetate to form three kinds of light-sensitive solutions.

| | parts by weight |
|---|---|
| Cross-Linking Agent: | |
| Triethylene glycol diacrylate | 50 |
| Photoactivator: | |
| Benzoin isopropyl ether | 0.55 |
| Heat Polymerization Inhibitor: | |
| p-Methoxyphenol | 0.02 |
| Colorant: | |
| C.I. Solvent Blue 73 | 0.5 |
| Surfactant: | |
| Polyoxyethylene sorbitan monolaurate | 0.5 |

These above ingredients were used in common, and the following copolymers were used respectively in the Comparative Examples 3 to 5.

TABLE 3

| Comparative Example | Copolymer | Parts by Weight |
|---|---|---|
| 3 | Styrene-monoethyl maleate copolymer (mole ratio 1:1) | 80 |
| 4 | Methyl methacrylate-methacrylic acid copolymer (mole ratio 9:1) | 80 |
| 5 | Maleic anhydride-octadecene-1 copolymer (GULF PA-18, a product of Gulf Oil Chemical, U.S.A) | 30 |
|  | Methyl methacrylate-methacrylic acid copolymer (mole ratio 9:1) | 50 |

Each of the light-sensitive solutions was coated on a phenol resin laminate clad on one surface with 1 ounce of a copper foil by means of a rotary coating machine at 60 rpm, and dried at 80° C. to form a light-sensitive layer having a thickness of 10 to 15μ. The copper foil surface had been degreased with 1,1,1-trichloroethane, treated with 5% HCl, and washed with water in a customary manner.

Each of the three light-sensitive layers was brought into intimate contact in vacuo with a test pattern of a polyethylene terephthalate film base, and irradiated for 60 seconds with light from a superhigh pressure mercury vapor lamp (3 kw) disposed at a distance of 1 meter (intensity 4.7 mW/cm²).

After the exposure, each of the laminate plates was dipped for 2 minutes in a 0.5% aqueous solution of sodium carbonate at 25° C., washed with water, rinsed with 3% H₃PO₄, again washed with water, and then dried under heat.

The following test was performed on the above three light-sensitive solutions and light-sensitive layers and the results tabulated below were obtained.

The methods of evaluation of the test items were as follows:

Coatability

Formation of a coating was evaluated by the uniformity of the surface of the light-sensitive layer.

Resolution

Evaluated by the resolution of a line drawing with a line width of 100μ and the sharpness of the edge.

Tackiness

Evaluated by a finger touch test of tackiness, and by the presence or absence of adhesion of an original having a silver salt image after contact exposure through the original.

Developability

Evaluated by the time required for development with a 0.5% aqueous solution of sodium carbonate, and by the presence or absence of a development residue.

Peelability

Evaluated by the ease of peeling with a 5% aqueous solution of sodium hydroxide.

Etch Resistance

Evaluated by the sharpness of an etch image obtained using a 40° Bé aqueous solution of FeCl₃ for copper foil etching, and by the intrusion of the etching solution.

TABLE 4

| | Results of Comparative Examples | | |
|---|---|---|---|
| | Comparative Examples | | |
| Test | 3 | 4 | 5 |
| Coatability | A | C | C |
| Rate of light sensitization | B | C | C |
| Resolution | B | B | B |
| Tackiness | C | B | B |
| Developability | A | C | C |
| Peelability | A | A | A |
| Etch resistance | B | B | B |

Note: Evaluations A, B and C correspond respectively to Excellent, Good and Poor.

While the invention has been described in detail and with reference to specific embodiments thereof, it will be apparent to one skilled in the art that various changes and modifications can be made therein without departing from the spirit and scope thereof.

What is claimed is:

1. A photocurable composition comprising two copolymers a first copolymer being a copolymer having a recurring unit of the general formula (I):

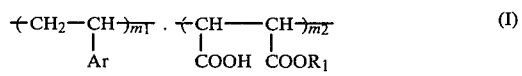

wherein Ar represents a substituted or unsubstituted phenyl group, $R_1$ represents a lower alkyl group, and $m_1$ and $m_2$ are positive numbers with $m_1$ being greater than or equal to $m_2$; and a second copolymer having a recurring unit of the general formula (II):

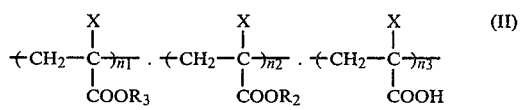

wherein $R_2$ represents a lower alkyl group, X represents a hydrogen atom or a methyl group, and $R_3$ represents an isobutyl group, a t-butyl group or a —CH₂Ar group where Ar represents a substituted or unsubstituted phenyl group and where $R_3$ is —CH₂Ar, $R_2$ can also be t-butyl and isobutyl, and $n_1$, $n_2$ and $n_3$ are positive numbers and $(n_1+n_2)/n_3$ equals to about 0.5 to 20; and containing suitable amounts of a cross-linking agent and a photoactivator.

2. The photocurable composition of claim 1, wherein said $R_3$ is a —CH₂Ar group.

3. The photocurable composition of claim 1, wherein said $R_3$ is t-butyl or isobutyl.

4. The photocurable composition of claim 1, wherein the weight ratio of copolymer I to copolymer II is from about 5 to 0.2.

5. The photocurable composition of claim 1, wherein said cross-linking agent is present in an amount of 5 to 150 wt% based on the combined weight of copolymers I and II.

6. The photocurable composition of claim 1, wherein said photoactivator is present in an amount of 0.01 to 20% by weight based on copolymers I and II and the cross-linking agent.

7. The photocurable composition of claim 1 additionally containing a thermal polymerization inhibitor.

8. A photocurable material comprising a support having thereon the photocurable composition of claim 1, 2, 3 or 4.

9. The photocurable material of claim 8, wherein said material does not include a protective layer.

10. The photocurable composition of claim 1, wherein said copolymer I is a copolymer of α-methylstyrene, m- or p-vinyltoluene, o- or p-chlorostyrene or o- or p-methoxystyrene and monomethyl maleate, monoethyl maleate, monoisopropyl maleate, mono-n-propyl maleate, mono-n-butyl maleate, monoisobutyl maleate or monotert-butyl maleate.

11. The photocurable composition of claim 1, 2 or 10, wherein said copolymer II is a copolymer of (A) benzyl methacrylate, benzyl acrylate, o-, m- or p-chloro, bromo- or iodobenzylmethacrylate, o-, m- or p-chloro-, bromo- or iodobenzylacrylate, o-, m- or p-nitrobenzylmethacrylate, o-, m- or p-nitrobenzylacrylate, o-aminobenzylmethacrylate, o-aminobenzylacrylate, o- or p-methoxybenzylmethacrylate, o- or p-methoxybenzylacrylate, o-methylbenzylmethacrylate, o-methylbenzylacrylate, 2,3-dimethylbenzylmethacrylate or 2,3-dimethylbenzylacrylate; (B) methyl methacrylate, methyl acrylate, ethyl methacrylate, ethyl acrylate, n-propyl methacrylate, n-propyl acrylate, isopropyl methacrylate, isopropyl acrylate n-butyl methacrylate, n-butyl acrylate, isobutyl methacrylate, isobutyl acrylate, t-butyl methacrylate or t-butyl acrylate; and (C) methacrylic acid or acrylic acid.

12. The photocurable composition of claim 1, 3 or 10, wherein said copolymer II is a copolymer of (A) isobutyl methacrylate, isobutyl acrylate, t-butyl methacrylate or t-butyl acrylate; (B) methyl methacrylate; methyl acrylate, ethyl methacrylate, ethyl acrylate, n-propyl methacrylate, n-propyl acrylate, isopropyl methacrylate, isopropyl acrylate, n-butyl methacrylate, n-butyl acrylate, isobutyl methacrylate, isobutyl acrylate, t-butyl methacrylate or t-butyl acrylate; and (C) methacrylic acid or acrylic acid.

13. The photocurable composition of claim 2, wherein Ar is benzyl.

14. The photocurable composition of claim 1 or 5, wherein said cross-linking agent has a boiling point greater than 150° C. and at least two ethylenically unsaturated bonds or azide groups.

15. The photocurable composition of claim 14, wherein said cross-linking agent is furfuryl methacrylate, diethylene glycol dimethacrylate, triethylene glycol dimethacrylate, tetraethylene glycol dimethacrylate, hexamethylene glycol dimethacrylate, neopentyl glycol dimethacrylate, trimethylol propane dimethacrylate, trimethylol propane trimethacrylate, tetramethylol methane tetramethacrylate, resorcinol dimethacrylate p,p'-dihydroxydiphenyl dimethacrylate, bisphenol A diglycidyl dimethacrylate, the corresponding acrylates of said methacrylates, diallyl phthalate, diallyl acrylamide, methylenebis-acrylamide, or 5,5-diallylbarbituric acid.

16. The photocurable composition of claim 14, wherein said cross-linking agent is p,p'-diphenyl bis(azide)methane, p,p'-bis(azide)benzophenone, p,p'-bis(azide)azobenzene, or a compound resulting from the conversion of the diazo groups of a condensate of p-diazodiphenylamine and formaldehyde into azide groups.

17. The photocurable composition of claim 1 or 6, wherein said photoactivator is benzophenone, benzil, p,p'-bis(dimethylamino)benzophenone, p,p'-bis(diethylamino)benzophenone, benzoin methyl ether, benzoin ethyl ether, benzoin isopropyl ether, benzoin butyl ether, anthraquinone, acenaphthenequinone, β-tert-butyl-anthraquinone, phenanthrenequinone, primulin, carbazole, xanthone, thioxanthone, carbon tetrabromide, or ω,ω,ω-tribromomethylphenylsulfone.

18. The photocurable composition of claim 1, wherein said copolymer I is a copolymer of styrene and a monoalkyl maleate and said copolymer II is a copolymer of benzyl methacrylate, a lower alkyl methacrylate and methacrylic acid.

* * * * *